United States Patent
Kim et al.

(10) Patent No.: US 12,104,115 B2
(45) Date of Patent: Oct. 1, 2024

(54) COMPOSITE MATERIAL

(71) Applicant: LG CHEM, LTD., Seoul (KR)

(72) Inventors: So Jin Kim, Daejeon (KR); Jong Min Shin, Daejeon (KR); Dong Woo Yoo, Daejeon (KR)

(73) Assignee: LG Chem, LTD., Seoul (KR)

( * ) Notice: Subject to any disclaimer, the term of this patent is extended or adjusted under 35 U.S.C. 154(b) by 866 days.

(21) Appl. No.: 17/254,364

(22) PCT Filed: Jun. 28, 2019

(86) PCT No.: PCT/KR2019/007900
§ 371 (c)(1),
(2) Date: Dec. 21, 2020

(87) PCT Pub. No.: WO2020/005014
PCT Pub. Date: Jan. 2, 2020

(65) Prior Publication Data
US 2021/0269696 A1    Sep. 2, 2021

(30) Foreign Application Priority Data

Jun. 29, 2018 (KR) .......................... 10-2018-0075959

(51) Int. Cl.
*C09K 5/14* (2006.01)
*B22F 3/11* (2006.01)
*B22F 3/24* (2006.01)

(52) U.S. Cl.
CPC .................. *C09K 5/14* (2013.01); *B22F 3/11* (2013.01); *B22F 3/24* (2013.01); *B22F 2003/242* (2013.01)

(58) Field of Classification Search
CPC ....................................................... B22F 3/11
See application file for complete search history.

(56) References Cited

U.S. PATENT DOCUMENTS

| | | | | |
|---|---|---|---|---|
| 5,848,351 A * | 12/1998 | Hoshino | ............... | B22F 3/1103 |
| | | | | 428/553 |
| 7,632,565 B1 | 12/2009 | Imam et al. | | |
| 8,329,091 B2 * | 12/2012 | Maffia | ................... | B22F 3/1121 |
| | | | | 75/228 |
| 2010/0028710 A1 * | 2/2010 | Gros | ..................... | B22F 3/1021 |
| | | | | 228/164 |
| 2014/0116661 A1 | 5/2014 | Xu et al. | | |

FOREIGN PATENT DOCUMENTS

| | | |
|---|---|---|
| CN | 102029135 A | 4/2011 |
| CN | 102443797 A | 5/2012 |
| CN | 103990792 A | 8/2014 |
| CN | 106813226 A | 6/2017 |
| CN | 107936777 A | 4/2018 |
| EP | 3686001 A1 | 7/2020 |
| JP | H09162336 A | 6/1997 |
| JP | 2003064404 A | 3/2003 |
| JP | 2008207152 A | 9/2008 |
| JP | 2014534645 A | 12/2014 |
| KR | 20070079891 A | 8/2007 |
| KR | 20100049774 A | 5/2010 |
| KR | 20130047913 A | 5/2013 |
| KR | 20180041343 A | 4/2018 |
| KR | 20180062170 A | 6/2018 |
| KR | 20190030980 A | 3/2019 |
| WO | 2018087076 A1 | 5/2018 |

OTHER PUBLICATIONS

International Search Report corresponding to PCT/KR2019/007900; dated Sep. 27, 2019 (5 pages, including English translation).
Extended European Search Report corresponding to EP 19825703.2 mailed Jul. 5, 2021 (9 pages).

* cited by examiner

*Primary Examiner* — Peter F Godenschwager

(74) *Attorney, Agent, or Firm* — Saliwanchik, Lloyd & Eisenschenk

(57) ABSTRACT

The present application provides a composite material and a method for producing the same. The present application can provide a composite material which comprises a metal foam and a polymer component, and has other excellent physical properties such as impact resistance, processability and insulation properties while having excellent thermal conductivity.

11 Claims, 1 Drawing Sheet

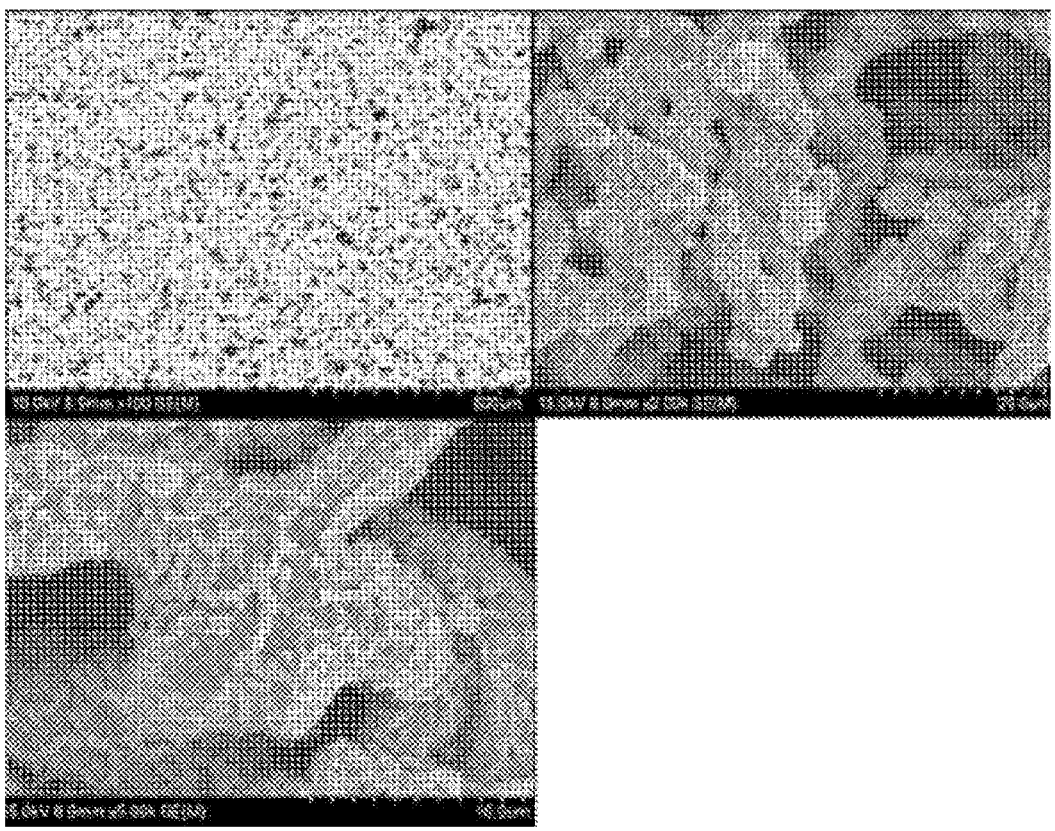

COMPOSITE MATERIAL

CROSS REFERENCE TO RELATED APPLICATIONS

This application is a 35 U.S.C. § 371 national stage application of PCT International Application No. PCT/KR2019/007900, filed Jun. 28, 2019, which claims priority from Korean Patent Application No. 10-2018-0075959, filed Jun. 29, 2018, the contents of which are incorporated herein in their entireties by reference. The above-referenced PCT International Application was published in the Korean language as International Publication No. WO2020/005014 on Jan. 2, 2020.

TECHNICAL FIELD

The present application relates to a composite material.

BACKGROUND ART

Heat-dissipating materials can be used in various applications. For example, since batteries and various electronic apparatuses generate heat during operation, a material capable of effectively controlling such heat is required.

As materials having good heat dissipation properties, ceramic materials having good thermal conductivity and the like are known, but since such materials have poor processability, a composite material produced by blending the ceramic filler or the like exhibiting high thermal conductivity in a polymer matrix can be used.

However, since a large amount of filler components must be applied in order to secure high thermal conductivity by the above method, various problems arise. For example, in the case of a material containing a large amount of filler components, the material itself tends to become hard, and in such a case, impact resistance or the like is deteriorated.

DISCLOSURE

Technical Problem

The present application relates to a composite material and in one example, it is intended to provide a composite material ensuring other excellent physical properties such as impact resistance and processability while having excellent thermal conductivity, or a method for producing the same.

Technical Solution

Among physical properties referred to in this specification, the physical properties that the measurement temperature and/or the measurement pressure affect the results are the results measured at room temperature and/or normal pressure, unless otherwise specified.

The term room temperature is a natural temperature without warming or cooling, which means, for example, any one temperature in a range of 10° C. to 30° C., or a temperature of 23° C. or about 25° C. or so. Also, in this specification, the unit of temperature is Celsius (C), unless otherwise specified.

The term normal pressure is a natural pressure without pressurizing or depressurizing, which means, usually, about 1 atm or so of atmospheric pressure.

In this specification, in the case of physical properties in which the measurement humidity affects the results, the relevant physical properties are the physical properties measured at natural humidity which is not particularly controlled at the room temperature and/or normal pressure state.

The present application relates to a composite material. In the present application, the term composite material may mean a material comprising a metal foam and a polymer component.

In this specification, the term metal foam or metal skeleton means a porous structure comprising a metal or a metal alloy as a main component. Here, the fact that a metal or the like uses as a main component means that the ratio of the metal or the like is 55 wt % or more, 60 wt % or more, 65 wt % or more, 70 wt % or more, 75 wt % or more, 80 wt % or more, 85 wt % or more, 90 wt % or more, or 95 wt % or more based on the total weight of the metal foam or the metal skeleton. The upper limit of the ratio of the metal or the like contained as the main component is not particularly limited, and for example, the ratio of the metal may be 100 wt % or less, 99 wt % or less, or 98 wt % or less or so.

In this specification, the term porousness may mean a case where it has a porosity of at least 10% or more, 20% or more, 30% or more, 40% or more, 50% or more, 60% or more, 70% or more, 75% or more, or 80% or more. The upper limit of the porosity is not particularly limited, which may be, for example, less than about 100%, about 99% or less, about 98% or less, 95% or less, 90% or less, 85% or less, or 80% or less or so. The porosity can be calculated in a known manner by calculating the density of the metal foam or the like.

The composite material of the present application has high thermal conductivity, and accordingly, it can be used as a material for controlling heat, such as a heat-dissipating material.

For example, the composite may have thermal conductivity of about 0.4 W/mK or more, 0.45 W/mK or more, 0.5 W/mK or more, 0.55 W/mK or more, 0.6 W/mK or more, 0.65 W/mK or more, 0.7 W/mK or more, 0.75 W/mK or more, 0.8 W/mK or more, 0.85 W/mK or more, 0.9 W/mK or more, 0.95 W/mK or more, 1 W/mK or more, 1.5 W/mK or more, 2 W/mK or more, 2.5 W/mK or more, 3 W/mK or more, 3.5 W/mK or more, 4 W/mK or more, 4.5 W/mK or more, 5 W/mK or more, 5.5 W/mK or more, 6 W/mK or more, 6.5 W/mK or more, 7 W/mK or more, 7.5 W/mK or more, 8 W/mK or more, 8.5 W/mK or more, 9 W/mK or more, 9.5 W/mK or more, or 10 W/mK or more. The higher the thermal conductivity of the composite material, the composite material may have more excellent thermal control functions, which is not particularly limited, and in one example, it may be about 100 W/mK or less, 90 W/mK or less, 80 W/mK or less, 70 W/mK or less, 60 W/mK or less, 50 W/mK or less, 40 W/mK or less, 30 W/mK or less, 20 W/mK or less, 15 W/mK or less, or 10 W/mK or less. The method of measuring the thermal conductivity is not particularly limited, which can be measured by, for example, the method described in the following examples.

While the composite material of the present application has excellent heat conduction properties as above, other properties such as processability and impact resistance can be stably secured, and such effects can be achieved by the contents described in this specification.

In one example, in a composite material that a metal foam and a polymer component are compounded, the present application applies, as the metal foam, a metal foam in which a metal oxide is introduced on the surface. The metal oxide may be an oxide having a protrusion form grown on the surface of the metal foam by a specific method. Such a metal oxide controls the surface characteristics of the metal foam without sacrificing the advantages of the metal foam, for example, excellent thermal conductivity, processability, mechanical strength, etc., whereby the metal foam can exhibit excellent interface characteristics with the polymer which is an organic material. Therefore, composites containing such metal foams can exhibit excellent properties.

Here, the protrusion shape means a shape having an aspect ratio in a range of approximately 1 to 8. In another example, the aspect ratio of the protrusion shape may be about 7.5 or less, 7 or less, 6.5 or less, 6 or less, 5.5 or less, 5 or less, 4.5 or less, 4 or less, 3.5 or less, or 3 or less. Here, the aspect ratio of the oxide may be the ratio (L/S) of the largest dimension (L) to the smallest dimension (S) among dimensions, such as the height or width, and the like of the oxide, which are identified through an optical microscope or the like, where the dimensions (L, S) are dimensions in the same unit. The desired effect can be achieved excellent by the presence of such protrusion-shaped oxides.

In the metal foam, the metal oxide present on the surface of the metal foam may have an area ratio in a range of 5% to 60%. In another example, the area ratio may be about 7% or more, or 10% or more, or may be 55% or less, 50% or less, 45% or less, 40% or less, 35% or less, or 30% or less or so. The area ratio is a percentage of the area, in which the oxide is present, relative to the total area of the metal foam, which can be determined through the area of the oxide and the area of the metal foam that are confirmed by an optical microscope or can also be calculated through the weight of the metal foam and the weight of the oxide, and the like.

The shape of the metal foam contained in the composite material is not particularly limited, but may be a film shape in one example. In the composite material of the present application, a polymer component existing on the surface or in the interior of the metal foam in the film form is added.

Such a polymer component may form a surface layer on at least one surface of the metal foam, or may be filled and present in the voids inside the metal foam, and in some cases, it may also be filled into the metal foam while forming the surface layer. In the case of forming a surface layer, the polymer component may form the surface layer on at least one surface, some surfaces, or all surfaces among surfaces of the metal foam. In one example, the polymer component may form the surface layer on at least the upper and/or lower surfaces, which are the main surfaces of the metal foam. The surface layer may be formed to cover the entire surface of the metal foam, or may also be formed to cover only a part of the surface.

The metal foam in the composite material may have a porosity in a range of about 10% to 99%. The metal foam having this porosity has a porous metal framework forming a suitable heat transfer network, and thus it can ensure excellent thermal conductivity even if a small amount of the relevant metal foam is applied. In another example, the porosity may be 15% or more, 20% or more, 25% or more, 30% or more, 35% or more, 40% or more, 45% or more, 50% or more, 55% or more, 60% or more, or 65% or more, or may be 98% or less, 95% or less or so, 90% or less or so, 85% or less or so, 80% or less or so, or 75% or less or so.

As described above, the metal foam may be in the form of a film. In this case, the thickness of the film can be adjusted in consideration of the desired thermal conductivity or thickness ratio, and the like, in manufacturing a composite material according to a method to be described below: In order to ensure the target thermal conductivity, the thickness of the film may be, for example, about 10 µm or more, about 20 µm or more, about 30 µm or more, about 40 µm or more, about 45 µm or more, about 50 µm or more, about 55 µm or more, about 60 µm or more, about 65 µm or more, or about 70 µm or more. The upper limit of the thickness of the film is controlled according to the purpose, which is not particularly limited, but may be, for example, about 1,000 µm or less, about 900 µm or less, about 800 µm or less, about 700 µm or less, about 600 µm or less, about 500 µm or less, about 400 µm or less, about 300 µm or less, about 200 µm or less, or about 150 µm or less or so.

In this specification, when the thickness of the relevant target is not constant, the thickness may be a minimum thickness, a maximum thickness or an average thickness of the target.

The metal foam may be a material having high thermal conductivity. In one example, the metal foam may comprise or consist of a metal or a metal alloy having thermal conductivity of about 8 W/mK or more, about 10 W/mK or more, about 15 W/mK or more, about 20 W/mK or more, about 25 W/mK or more, about 30 W/mK or more, about 35 W/mK or more, about 40 W/mK or more, about 45 W/mK or more, about 50 W/mK or more, about 55 W/mK or more, about 60 W/mK or more, about 65 W/mK or more, about 70 W/mK or more, about 75 W/mK or more, about 80 W/mK or more, about 85 W/mK or more, or about 90 W/mK or more. The thermal conductivity is not particularly limited, which may be, for example, about 1,000 W/mK or less or so, because the higher the numerical value, the desired thermal control characteristics can be ensured while applying a small amount of the metal foam.

The skeleton of the metal foam may be composed of various kinds of metals or metal alloys, where a material capable of exhibiting thermal conductivity in the above-mentioned range may be selected from these metals or metal alloys. Such a material can be exemplified by any metal selected from the group consisting of tin, copper, gold, silver, aluminum, nickel, iron, cobalt, magnesium, molybdenum, tungsten and zinc, or an alloy of two or more thereof, and the like, but is not limited thereto.

Such metal foams are variously known, and also various methods for producing metal foams are variously known. In the present application, a metal form can be applied, in which in the metal foam produced by such a known method an oxide is formed on the surface in a specific manner to be described below:

As a method for producing a metal foam itself, a method of sintering a pore-forming agent such as a salt and a composite material of a metal, a method of coating a metal on a support such as a polymer foam and sintering it in this state or a slurry method, and the like is known, where these methods can be all applied. In the composite material of the present application, a method for producing a suitable metal foam will be described below.

The composite material further comprises a polymer component present on the surface of the metal foam or in the interior of the metal foam, as described above, wherein the ratio (T/MT) of the total thickness (T) to the thickness (MT) of the metal foam in such a composite material may be 2.5 or less. In another example, the thickness ratio may be about 2 or less, 1.5 or less, 1.4 or less, 1.3 or less, 1.2 or less, 1.15 or less, or 1.1 or less. The lower limit of the thickness ratio is not particularly limited, but in one example, it may be about 1 or more, about 1.01 or more, about 1.02 or more, about 1.03 or more, about 1.04 or more, or about 1.05 or more. Under such a thickness ratio, it is possible to provide a composite material having excellent processability or impact resistance, and the like, while ensuring the desired thermal conductivity.

The kind of the polymer component included in the composite material of the present application is not particularly limited, which may be selected in consideration of, for example, processability, impact resistance, insulation properties or the like of the composite material. An example of the polymer component applicable in the present application may include one or more selected from the group consisting of known acrylic resins, silicone resins, epoxy resins, urethane resins, amino resins, and phenol resins, but is not limited thereto.

In the case of the composite material, it is possible to secure excellent thermal conductivity while minimizing the ratio of components securing the thermal conductivity mainly through the application of the above-described metal foam, thereby securing the desired physical properties without damaging processability or impact resistance, and the like.

In one example, the ratio (MV/PV) of the volume (MV) of the metal foam and the volume (PV) of the polymer component contained in the composite material may be 10 or less. In another example, the ratio (MV/PV) may be 9 or less, 8 or less, 7 or less, 6 or less, 5 or less, 4 or less, 3 or less, 2 or less, 1 or less, or 0.5 or less or so. The lower limit of the volume ratio is not particularly limited, which may be, for example, about 0.1 or so. The volume ratio can be calculated through the weight of the polymer component and the metal foam, included in the composite material, and the density of the relevant components.

In one example, a thermally conductive filler may be included in the polymer component in order to secure higher thermal conductivity.

The term thermally conductive filler in the present application means a filler having thermal conductivity of about 1 W/mK or more, about 5 W/mK or more, about 10 W/mK or more, or about 15 W/mK or more. The thermal conductivity of the thermally conductive filler may be about 400 W/mK or less, about 350 W/mK or less, or about 300 W/mK or less. The kind of the thermally conductive filler is not particularly limited, and for example, a ceramic filler or a carbon-based filler, and the like can be applied. Such a filler can be exemplified by alumina, AlN (aluminum nitride), BN (boron nitride), silicon nitride, SiC or BeO, and the like, or a filler such as carbon nanotube or graphite, but is not limited thereto.

The shape or ratio of the filler included is not particularly limited. In one example, the shape of the filler may have various shapes such as a substantially spherical shape, a needle shape, a plate shape, a dendritic shape or a star shape, but is not particularly limited to the shape.

In one example, the thermally conductive filler may have an average particle diameter in a range of 0.001 µm to 80 µm. In another example, the average particle diameter of the filler may be 0.01 µm or more, 0.1 or more, 0.5 µm or more, 1 µm or more, 2 µm or more, 3 µm or more, 4 µm or more, 5 µm or more, or about 6 µm or more. In another example, the average particle diameter of the filler may be about 75 µm or less, about 70 µm or less, about 65 µm or less, about 60 µm or less, about 55 µm or less, about 50 µm or less, about 45 µm or less, about 40 µm or less, about 35 µm or less, about 30 µm or less, about 25 µm or less, about 20 µm or less, about 15 µm or less, about 10 µm or less, or about 5 µm or less.

The ratio of the filler can be adjusted within the range in which the desired properties are secured or undamaged. In one example, the filler may be included in the composite material in a volume ratio of about 80 vol % or less. Here, the volume ratio is a value calculated based on the weight and density of each of the components constituting the composite material, for example, the metal foam, the polymer component and the filler.

In another example, the volume ratio may be about 75 vol % or less, 70 vol % or less, 65 vol % or less, 60 vol % or less, 55 vol % or less, 50 vol % or less, 45 vol % or less, 40 vol % or less, 35 vol % or less, or about 30 vol % or less or so, or may be about 1 vol % or more, 2 vol % or more, 3 vol % or more, 4 vol % or more, or about 5 vol % or more or so.

The present application also relates to a method for producing the composite material. The manufacturing method may comprise steps of producing a metal foam and introducing a polymer component into the produced metal foam. The method for producing a metal foam may comprise a step of sintering a metal structure including a metal component to obtain a porous metal sintered body; and following the sintering step, a step of contacting the porous metal sintered body with oxygen. The aforementioned protrusion-shaped oxide can be grown on the surface of the metal foam through the contact with oxygen under proper conditions and such a protrusion-shaped oxide can control the surface area of the relevant metal foam without deteriorating the advantage of the metal foam.

In the present application, the term metal structure means a structure before the process which is performed to form a metal foam, such as the sintering, that is, a structure before forming the metal foam. In addition, even if the metal structure is referred to as a porous metal structure, it is not necessarily porous by itself, and it can be referred to as a porous metal structure for convenience, as long as it can finally form a metal foam, which is a porous metal structure.

There is no particular limitation on the kind of the metal component contained in the metal structure, and the above-mentioned material can be used.

The metal component forming the metal structure may be in the form of a powder. For example, the metals in the metal component may have an average particle diameter in a range of about 0.1 µm to about 200 µm. In another example, the average particle diameter may be about 0.5 µm or more, about 1 µm or more, about 2 µm or more, about 3 µm or more, about 4 µm or more, about 5 µm or more, about 6 µm or more, about 7 µm or more, or about 8 µm or more. In another example, the average particle diameter may be about 150 µm or less, 100 µm or less, 90 µm or less, 80 µm or less, 70 µm or less, 60 µm or less, 50 µm or less, 40 µm or less, 30 µm or less, or 20 µm or less. As the metal in the metal component, those having different average particle diameters may be applied. The average particle diameter can be appropriately selected in consideration of the shape of the desired metal foam, for example, the thickness or the porosity of the metal foam, which is not particularly limited.

The average particle diameter referred to in this specification is a so-called median particle diameter (also referred to as D50 particle diameter), which can be obtained by a known particle size analysis method.

In the present application, the metal structure including the metal component as above may be formed, in one example, by using a slurry comprising at least the metal component, a dispersant and a binder (hereinafter, may be referred to as slurry A).

The ratio of the metal component in the slurry A is not particularly limited, which can be selected in consideration of the desired viscosity, process efficiency, and the like. In one example, the ratio of the metal component in the slurry A may be 0.5% to 95% or so based on weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less, about 80% or less, about 75% or less, about 70% or less, about 65% or less, 60% or less, 55% or less, 50% or less, 45% or less, 40% or less, 35% or less, 30% or less, 25% or less, 20% or less, 15% or less, 10% or less, or 5% or less or so.

As the dispersant, for example, an alcohol may be applied. As the alcohol, a monohydric alcohol with 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol with 1 to 20 carbon atoms such as ethylene glycol, propylene glycol, hexanediol, octanediol or pentanediol, or a higher polyhydric alcohol, and the like may be used, but the kind is not limited to the above.

The slurry A may further comprise a binder. The kind of such a binder is not particularly limited, which may be appropriately selected depending on the kind of the metal component, or dispersant applied upon producing the slurry A. For example, the binder can be exemplified by an alkylcellulose having an alkyl group with 1 to 8 carbon atoms such as methylcellulose or ethylcellulose, a polyalkylene carbonate having an alkylene unit with 1 to 8 carbon atoms such as polypropylene carbonate or polyethylene carbonate, or a polyvinyl alcohol-based binder such as polyvinyl alcohol or polyvinyl acetate, and the like, but is not limited thereto.

The ratio of each component in the slurry A is not particularly limited. Such a ratio can be adjusted in consideration of the process efficiency such as coating property and moldability at the time of performing the process using the slurry A.

For example, in the slurry A, the binder may be contained at a ratio of about 1 to 500 parts by weight relative to 100 parts by weight of the above-described metal component. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 90 parts by weight or less, about 80 parts by weight or less, about 70 parts by weight or less, about 60 parts by weight or less, about 50 parts by weight or less, about 40 parts by weight or less, about 30 parts by weight or less, about 20 parts by weight or less, or about 10 parts by weight or less.

The dispersant in the slurry A may be included at a ratio of about 10 to 2,000 parts by weight relative to 100 parts by weight of the binder. In another example, the ratio may be about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 160 parts by weight or more, about 170 parts by weight or more, about 180 parts by weight or more, about 190 parts by weight or more, about 200 parts by weight or more, about 300 parts by weight or more, about 400 parts by weight or more, about 500 parts by weight or more, about 550 parts by weight or more, about 600 parts by weight or more, or about 650 parts by weight or more, and may be about 1,800 parts by weight or less, about 1,600 parts by weight or less, about 1,400 parts by weight or less, about 1,200 parts by weight or less, about 1,000 parts by weight or less, about 800 parts by weight or less, about 600 parts by weight or less, about 400 parts by weight or less, about 300 parts by weight or less, about 250 parts by weight or less or about 200 parts by weight or less, about 150 parts by weight or less, or about 120 parts by weight or less or so.

Unless otherwise specified, the unit weight part herein means a weight ratio between the respective components. By controlling the ratio of the dispersant or the binder in the slurry A as above, it is possible to form a desired appropriate level of metal oxide in the subsequent metal oxide formation process after the sintering process.

The slurry A may further comprise a solvent, if necessary. However, it may be advantageous to use the slurry A containing no solvent as the slurry A from the viewpoint of more efficiently modifying the surface of the metal foam in the process of the present application, which is followed by contact with oxygen after sintering. As the solvent, a suitable solvent may be used in consideration of solubility of the components of the slurry A, for example, the metal component or the binder, and the like. For example, as the solvent, one having a dielectric constant in a range of about 10 to 120 can be used. In another example, the dielectric constant may be about 20 or more, about 30 or more, about 40 or more, about 50 or more, about 60 or more, or about 70 or more, or may be about 110 or less, about 100 or less, or about 90 or less. Such a solvent can be exemplified by water or an alcohol with 1 to 8 carbon atoms such as ethanol, butanol or methanol, DMSO (dimethyl sulfoxide), DMF (dimethylformamide) or NMP (N-methylpyrrolidinone), and the like, but is not limited thereto.

When a solvent is applied, it may be present in the slurry A at a ratio of about 50 to 400 parts by weight relative to 100 parts by weight of the binder, but is not limited thereto.

The slurry A may also further comprise necessary known additives in addition to the above-mentioned components. However, for effectively obtaining the desired pore characteristics and forming a desired level of oxide in an oxidation process to be described below; the slurry may not contain a so-called foaming agent. The term foaming agent includes components which can exhibit a foaming effect in relation to other components in the slurry, as well as components commonly referred to in the industry as blowing agents other. Therefore, in the present application, the foaming process may not proceed during the process of manufacturing the metal foam.

The method of forming the metal structure using the slurry A as above is not particularly limited. In the field of manufacturing metal foams, various methods for forming metal structures are known, and in the present application, all these methods can be applied. For example, the metal structure can be formed by maintaining the slurry A in a suitable template, or by coating the slurry A in an appropriate manner.

The shape of such a metal structure is determined according to the desired metal foam and is not particularly limited. In one example, the metal structure may be in the form of a film or sheet. For example, when the structure is in the form of a film or sheet, the thickness may be 2,000 μm or less, 1,500 μm or less, 1,000 μm or less, 900 μm or less, 800 μm or less, 700 μm or less, 600 μm or less, 500 μm or less, 400 μm or less, 300 μm or less, 200 μm or less, 150 μm or less, about 100 μm or less, about 90 μm or less, about 80 μm or less, about 70 μm or less, about 60 μm or less, or about 55 μm or less. The metal foams have generally brittle characteristics due to their porous structural features, thereby being difficultly manufactured in the form of films or sheets, particularly thin films or sheets and having a problem of being easily broken even when they are manufactured. However, according to the method of the present application, it is possible to form a metal foam, in which pores are uniformly formed therein, while having a thin thickness, and having excellent mechanical characteristics.

Here, the lower limit of the thickness of the structure is not particularly limited. For example, the structure in the form of a film or sheet may be about 1 μm or more, about 5 μm or more, 10 μm or more, or about 15 μm or more.

The metal structure formed by such a method may be sintered to form a porous metal sintered body. In this case, the method of performing the sintering for producing the metal foam is not particularly limited, and a known sintering method can be applied. That is, the sintering can be performed in such a manner that an appropriate amount of heat is applied to the metal structure in an appropriate manner.

In the case of sintering the metal structure by applying heat, the applied heat is not particularly limited. That is, the heat application conditions may be appropriately adjusted in consideration of the properties of the used metal or the desired mechanical strength, and the like.

In one example, the porous metal sintered body can be formed by sintering a metal structure at any temperature in a range of 700° C. to 2,000° C.

In addition, the sintering time can also be suitably adjusted and the sintering can be performed for a time in a range of, for example, about 30 minutes to 600 minutes.

In another example of the present application, the metal structure comprising the metal component can be formed, in another example, by using the metal component, an aqueous solvent, an organic solvent, and a surfactant as a slurry (hereinafter, may be referred to as slurry B). The slurry B may be a slurry containing a foaming component, unlike the slurry A.

The kind of the metal component contained in the slurry B or the ratio of the metal component in the slurry is the same as that of the slurry A.

The slurry B comprises a metal powder (the metal component), an aqueous solvent, an organic solvent, and a surfactant. When the ratios and types of the aqueous solvent, the organic solvent and the surfactant are controlled in the slurry, a microemulsion is formed in the metal foam precursor, and while such an emulsion is vaporized under proper conditions, the foaming process can proceed. For example, due to the difference in vapor pressure between the organic solvent and the aqueous solvent, the component having a higher vapor pressure may be vaporized during the foaming process to control the pore characteristics of the metal foam.

Here, as the aqueous solvent, water or other polar solvents may be applied, and water may be typically applied. Such an aqueous solvent may be contained in the slurry at a ratio of 10 to 100 parts by weight relative to 100 parts by weight of the metal powder. In another example, the ratio of the aqueous solvent may be about 15 parts by weight or more, about 20 parts by weight or more, about 25 parts by weight or more, about 30 parts by weight or more, about 35 parts by weight or more, about 40 parts by weight or more, about 45 parts by weight or more, about 50 parts by weight or more, about 55 parts by weight or more, or about 60 parts by weight or more, or may also be about 95 parts by weight or less, about 90 parts by weight or less, about 85 parts by weight or less, about 80 parts by weight or less, about 75 parts by weight or less, or about 70 parts by weight or less.

As the organic solvent, a suitable kind can be selected without any particular limitation. As such an organic solvent, for example, a hydrocarbon-based organic solvent can be applied. As the hydrocarbon-based organic solvent, an organic solvent having 4 to 12 carbon atoms can be applied, and as a specific example, n-pentane, neopentane, hexane, isohexane, cyclohexane, heptane, isoheptane, octane, toluene or benzene, and the like can be applied. Such an organic solvent may be contained in the slurry at a ratio of 0.01 to 10 parts by weight relative to 100 parts by weight of the metal powder. In another example, the ratio of the organic solvent may be about 0.05 part by weight or more, about 0.1 part by weight or more, about 0.15 parts by weight or more, about 0.2 parts by weight or more, about 0.25 parts by weight or more, about 0.3 parts by weight or more, about 0.35 parts by weight or more, about 0.4 parts by weight or more, about 0.45 parts by weight or more, about 0.5 parts by weight or more, about 0.55 parts by weight or more, about 0.6 parts by weight or more, about 0.65 parts by weight or more, about 0.7 parts by weight or more, about 0.75 parts by weight or more, about 0.8 parts by weight or more, about 0.85 parts by weight or more, about 0.9 parts by weight or more, about 0.95 parts by weight or more, about 1 part by weight or more, about 1.05 parts by weight or more, about 1.1 parts by weight or more, about 1.15 parts by weight or more, about 1.2 parts by weight or more, about 1.25 parts by weight or more, about 1.3 parts by weight or more, about 1.35 parts by weight or more, about 1.4 parts by weight or more, about 1.45 parts by weight or more, or may also be about 9 parts by weight or less, about 8 parts by weight or less, about 7 parts by weight or less, about 6 parts by weight or less, about 5 parts by weight or less, about 4 parts by weight or less, about 3 parts by weight or less, or about 2 parts by weight or less.

For formation of a suitable microemulsion in the metal foam precursor and/or suitable control of the above-described vaporization, a surfactant may be included.

In the present application, as the surfactant, any one selected from the group consisting of an amphoteric surfactant, a nonionic surfactant and an anionic surfactant or a mixture of two or more thereof can be applied. In some cases, even when any one of the amphoteric surfactant, the nonionic surfactant and the anionic surfactant is used, a mixture of two or more surfactants having different structures in the one kind can be applied as well.

Among the above surfactants, an appropriate type for forming the desired microemulsion may be selected, and the types of the aqueous solvent and the organic solvent applied in the process may be considered.

As is well known, the anionic surfactant is a surfactant in which the part showing interfacial activity is an anion, and as the anionic surfactant, for example, a carboxylate compound, a sulfate compound, an isethionate compound, a sulfosuccinate compound, a taurate compound and/or a glutamate compound can be applied, without being limited thereto.

As is well known, the nonionic surfactant is a surfactant which is not separated into ions, and as such a surfactant, for example, an alkylpolyglucoside-based surfactant, a fatty acid alkanolamide-based surfactant, or surfactants in forms that ethylene oxide is added to amine oxide series and higher alcohols and that ethylene oxide is added to oils, and the like can be used.

The amphoteric surfactant is a surfactant which has both an anionic site and a cation site, and as such a surfactant, betaines, for example, cocamidopropyl betaine, lauramidopropyl betaine, coco betaine or lauryl betaine, and the like, or sultaine series, for example, lauryl hydroxysultaine, lauramidopropyl sultaine, cocamidopropyl hydroxysultaine or coco sultaine, and the like can be applied, without being limited thereto.

As the surfactant, any one of the anionic, nonionic or amphoteric surfactants of each formula as mentioned above may be used alone, or two or more surfactants may be mixed and used.

The surfactant may be contained in the slurry at a ratio of 1 to 10 parts by weight relative to 100 parts by weight of the metal powder. In another example, the ratio may be about 1.5 parts by weight or more, about 2 parts by weight or more, about 2.5 parts by weight or more, about 3 parts by weight or more, about 3.5 parts by weight or more, about 4 parts by weight or more, or about 4.5 parts by weight or more, or may also be about 9.5 parts by weight or less, about 9 parts by weight or less, about 8.5 parts by weight or less, about 8 parts by weight or less, about 7.5 parts by weight or less, about 7 parts by weight or less, about 6.5 parts by weight or less, about 6 parts by weight or less, or about 5.5 parts by weight or less.

The slurry B may also further comprise necessary components in addition to the above components. For example, the slurry may further comprise a binder.

The binder can be appropriately selected, for example, from binders having water solubility or depending on the kind of the metal powder, the aqueous solvent, the organic solvent and/or the surfactant applied upon preparing the slurry, without any particular limitation. For example, as the binder, the same kind of material as described as the binder in the above-described first slurry can be applied.

The binder may be contained in the slurry at a ratio of 1 to 100 parts by weight relative to 100 parts by weight of the metal powder. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, or about 10 parts by weight or more, or may also be about 90 parts by weight or less, about 80 parts by weight or less, about 70 parts by weight or less, about 60 parts by weight or less, about 50 parts by weight or less, about 40 parts by weight or less, about 30 parts by weight or less, about 20 parts by weight or less, or about 15 parts by weight or less. Under this ratio, metal foams with desired pore characteristics can be produced effectively.

The slurry B may also further comprise a plasticizer to impart plasticity to the metal foam or its precursor. As the plasticizer, a suitable type capable of imparting plasticity to the above-mentioned slurry system or metal foam can be selected and, for example, a polyhydric alcohol, a fat, an ether compound or an ester compound, and the like can be applied, without being limited thereto.

When the plasticizer is included, it may be contained in the slurry at a ratio of 0.5 to 10 parts by weight relative to 100 parts by weight of the metal powder. In another example, the ratio may be about 1 part by weight or more, about 1.5 parts by weight or more, about 2 parts by weight or more, about 2.5 parts by weight or more, or about 3 parts by weight or more, or may also be about 9 parts by weight or less, about 8 parts by weight or less, about 8 parts by weight or less, about 6 parts by weight or less, about 5 parts by weight or less, or about 4 parts by weight or less. Under this ratio, metal foams with desired pore characteristics can be produced effectively.

The slurry B may also further comprise necessary known additives, in addition to the above-mentioned components.

The method of forming the metal foam precursor by using the slurry B is not particularly limited and is the same as in the case of the slurry A.

In the case of the metal precursor using the slurry B, a metal sintered body can be obtained through the same sintering process as the case of the above-mentioned slurry A.

In the case of the metal precursor formed with the slurry B, the foaming process may also proceed before the sintering process. The foaming process may be applied to the case of the precursor formed with the slurry B or formed by using the slurry A and the slurry B together, but not when the slurry A is used alone. The foaming process can proceed, for example, in such a manner that a desired microemulsion is vaporized in a state where the emulsion has been formed in the precursor. For example, the foaming process can be performed by maintaining the metal foam precursor at a temperature in the range of about 20° C. to 100° C. for an appropriate period of time. The foaming process may proceed while the microemulsion is vaporized by the difference in vapor pressure between the aqueous solvent and the organic solvent under this condition. The time of the foaming process is determined according to the purpose, which is not particularly limited, and it can be performed, for example, for a time in a range of about 1 minute to 10 hours or so, but is not limited thereto.

The metal foam sintered body can be produced by sintering the metal foam precursor formed in the above manner. In this case, the manner of performing the sintering is not particularly limited, and the contents described in the case of the slurry A may be applied equally.

In the manufacturing method of the present application, the metal sintered body thus formed is brought into contact with oxygen to modify the surface. Such a contact process with oxygen can be performed immediately after the sintering process. In one example, the contact with the oxygen can be performed while cooling the porous metal sintered body immediately after the sintering process, and in the cooling process, the porous metal sintered body can start the contact with oxygen when the temperature of the present atmosphere has reached a certain level. The cooling may also be forced cooling or natural cooling. In the present application, the oxide can be grown on the surface of the metal foam through control of such contact conditions with oxygen, and in particular, the object can be achieved by appropriately growing the oxide in the form of protrusions.

Accordingly, in one example, the contacting step with oxygen may comprise steps of: sintering the metal structure and then naturally cooling or forced-cooling the sintered body; and contacting the sintered body with oxygen when the temperature is in a range of 300° C. to 600° C. in the natural or forced cooling process.

In one example, the contacting step with the oxygen can be performed while cooling the metal foam followed by the sintering process, and in this case, the surface modified metal foam can be formed by one step.

In one example, for growth of a suitable oxide, the contact with oxygen may be performed in an atmosphere having the oxygen concentration of 1 ppm to 10.000 ppm or 1 ppm to 1,000 ppm, and it may also be performed in an oxygen concentration atmosphere of 10 ppm to 1,000 ppm. In one example, the sintering of the metal structure may be performed under an atmosphere of a reaction gas, such as hydrogen or argon, or an inert gas, where after performing the sintering in the reaction or inert gas atmosphere and then cooling the sintered body, the contact with oxygen may be performed by injecting oxygen at an appropriate concentration when it has reached the desired appropriate temperature. The concentration of oxygen can be adjusted, for example, by injecting oxygen into a chamber or the like so as to have the intended concentration.

In one example, the contact with oxygen for surface modification can be performed while cooling the porous metal sintered body. The cooling may be forced cooling or natural cooling. That is, after the sintering process for forming the metal sintered body, the surface modification process may be performed by a method of injecting oxygen at an appropriate time while cooling the metal sintered body.

Without contacting the metal structure with oxygen at the time of the sintering, the contact with oxygen can be performed by injecting oxygen at a proper timing of the cooling process after sintering.

In one example, the contact with oxygen can be started and performed at a temperature of 300° C. to 600° C. That is, while the sintered body is cooled after sintering, the contact with oxygen can be performed by injecting oxygen when the temperature has reached the above range. In another example, the start temperature of the oxygen contact may be about 320° C. or more, 340° C. or more, 360° C. or more, 380° C. or more, or 400° C. or more, or may be 580° C. or less, 560° C. or less, 540° C. or less, 520° C. or less, or 500° C. or less.

In one example, the contact with oxygen may begin at the above temperature and be performed until the holding temperature (ambient temperature) of the porous metal sintered body is cooled to about 10° C. to 50° C. or so.

In the case where the contact with oxygen is performed while cooling the sintered body as described above, the cooling rate is not particularly limited. In one example, the cooling may be natural cooling.

For example, the contact with oxygen can be performed while the temperature is lowered by natural cooling from the start temperature of the oxygen contact to the end temperature of the oxygen contact, where it can be performed, for example, for 10 minutes to 5 hours.

Through the contact with oxygen as above, metal foams having desired surface characteristics can be obtained.

After the oxide is formed on the surface of the metal foam in the same manner as above, a composite material can be prepared by introducing a polymer component into the surface of or inside the metal foam. At this time, the method of introducing a polymer component is not particularly limited and is performed in a known manner. For example, when a curable polymer composition or the like is used, it may comprise a step of curing the curable polymer composition in a state where the polymer composition is present on the surface of or inside the metal foam.

The details of the metal foams applied in the above method are as described above, and specific matters of the composite material to be manufactured can also follow the above-described contents.

On the other hand, the polymer composition applied in the above is not particularly limited as long as it can form the above-mentioned polymer component through curing or the like, and such polymer components are variously known in the art. That is, for example, the composite material can be prepared by performing the curing through a known method using a material having appropriate viscosity among known components.

Advantageous Effects

The present application can provide a composite material which comprises a metal foam and a polymer component, and has other excellent physical properties such as impact resistance, processability and insulation properties while having excellent thermal conductivity.

BRIEF DESCRIPTION OF DRAWINGS

FIG. 1 is a photograph of a metal foam formed in an example.

MODE FOR INVENTION

Hereinafter, the present application will be described in detail by way of examples and comparative examples, but the scope of the present application is not limited to the following examples.

Example 1

The metal foam was a copper metal foam, where the copper metal foam in a film shape, in which the oxide in the form of protrusions is present on the surface, having a thickness of about 90 μm or so and a porosity of about 65% to 75% was used. The copper foam was prepared with a slurry using a copper (Cu) powder with an average particle diameter (D50 particle diameter) of about 10 to 20 μm or so as a metal component, using alpha-terpineol as a dispersant and applying polyvinyl acetate as a binder. The weight ratio (Cu:dispersant:binder) of the metal component (Cu), the dispersant and the binder in the slurry was about 1:1.11:0.09 or so. The slurry was coated so as to form the film of the above thickness and dried at a temperature of about 100° C. for about 40 minutes. Subsequently, the structure in the form of a film was heat-treated (sintered) at a temperature of about 900° C. for about 1 hour in a hydrogen/argon gas atmosphere of 4%, and the metal component was bonded while removing the organic components to prepare a porous metal sintered body. After the sintering, the sintered body was naturally cooled and simultaneously brought into contact with oxygen by injecting oxygen gas to have a concentration in a range of about 400 ppm to 700 ppm at an ambient temperature of about 500° C. or so until the ambient temperature become room temperature (about 25° C.). FIG. 1 is a photograph of the sheet prepared in Example 1, and it can be confirmed from the photograph that the oxide in the form of protrusions is grown on the surface of the metal foam. The aspect ratio of the protrusion shape was in the range of about 1 to 3, and the area ratio of the oxide was about 10% to 30% or so. The copper foam was impregnated with a thermosetting silicone resin composition (Dow Corning, PDMS, Sylgard 183 Kit), and an excess amount of the composition was removed using an applicator so that the final composite material had a thickness of about 110 μm or so. Subsequently, the material was maintained in an oven at about 120° C. for about 10 minutes or so and cured to prepare a composite material. As a result of being calculated based on the density and the applied weight of each of the applied polymer component (silicone resin) and metal foam (copper foam), the ratio (MV/PV) of the volume (MV) of the metal foam to the volume (PV) of the polymer component was about 0.3 or so. The thermal conductivity of this composite material was about 5.12 W/mK or so.

The thermal conductivity was determined by obtaining the thermal diffusivity (A), specific heat (B) and density (C) of the composite material and substituting them into an equation of thermal conductivity=ABC, where the thermal diffusivity was measured with a laser flash method (LFA equipment, model name: LFA467), the specific heat was measured by way of DSC (differential scanning calorimeter) equipment and the density was measured with Archimedes method. Also, the thermal conductivity is a value with respect to the thickness direction (Z axis) of the composite material.

Example 2

A composite material was prepared in the same manner as in Example 1, except that a different kind of composition (Dow Corning, PDMS, Sylgard 527 Kit) was used as the thermosetting silicone resin composition. As a result of measuring the thermal conductivity of the prepared composite material in the above-mentioned manner, it was about 6.86 W/mK or so.

Example 3

A composite material was prepared in the same manner as in Example 2, except that a plate-like boron nitride powder was introduced into a thermosetting silicone resin composition (Dow Corning, PDMS, Sylgard 527 Kit) at a ratio of about 10 wt % or so and used. As a result of measuring the thermal conductivity of the prepared composite material in the above-mentioned manner, it was about 10.14 W/mK or so.

What is claimed is:

1. A method of producing a composite material that has a thermal conductivity of 0.4 W/mK or more, the method comprising:
   forming a porous metal body by sintering a metal structure comprising a metal component;
   forming a metal oxide having a protrusion form grown on a surface of the porous metal body by contacting the porous metal body with oxygen, wherein an aspect ratio of the protrusion is in a range of 1 to 8, wherein contacting the porous metal body with oxygen is performed under an oxygen concentration of 1 ppm to 10,000 ppm; and then
   applying a polymer component to the porous metal body.
2. The method according to claim 1 further comprising forming the metal structure using a slurry including the metal component, a dispersant and a binder.
3. The method according to claim 2, wherein the dispersant is an alcohol.
4. The method according to claim 2, wherein the binder is an alkylcellulose, a polyalkylene carbonate or a polyvinyl alcohol.
5. The method according to claim 2, wherein the slurry comprises 1 to 500 parts by weight of the binder relative to 100 parts by weight of the metal component.
6. The method according to claim 2, wherein the slurry comprises 10 to 2,000 parts by weight of the dispersant relative to 100 parts by weight of the binder.
7. The method according to claim 1, wherein contacting the porous metal body with oxygen is performed at a temperature in a range of 300° C. to 600° C.
8. The method according to claim 7 further comprising
   naturally cooling the porous metal body after sintering the metal structure,
   wherein contacting the porous metal body with oxygen is performed when the temperature is in the range of 300° C. to 600° C. naturally cooling the porous metal body.
9. The method according to claim 1, further comprising naturally cooling the porous metal body, wherein naturally cooling the porous metal body and contacting the porous metal body with oxygen are performed simultaneously.
10. The method according to claim 9, wherein contacting the porous metal body with oxygen comprising injecting a gas having an oxygen concentration in a range of about 400 ppm to 700 ppm at an ambient temperature of about 500° C.
11. The method according to claim 1, wherein sintering the metal structure is performed in a hydrogen/argon atmosphere.

* * * * *